(12) United States Patent
Huber (10) Patent No.: US 6,366,520 B1
(45) Date of Patent: Apr. 2, 2002

(54) METHOD AND SYSTEM FOR CONTROLLING THE SLEW RATE OF SIGNALS GENERATED BY OPEN DRAIN DRIVER CIRCUITS

(75) Inventor: Brian W. Huber, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/808,727

(22) Filed: Mar. 14, 2001

(51) Int. Cl.$^7$ .................................................. G11C 7/00
(52) U.S. Cl. .......................... 365/226; 365/198; 326/83; 327/170
(58) Field of Search ................................. 365/226, 198; 327/170; 326/83, 86

(56) References Cited

U.S. PATENT DOCUMENTS

| | | | |
|---|---|---|---|
| 5,537,070 A | | 7/1996 | Risinger ..................... 327/170 |
| 5,781,050 A | * | 7/1998 | Russell ....................... 327/170 |
| 5,877,634 A | * | 3/1999 | Hunley ......................... 326/83 |
| 6,037,803 A | * | 3/2000 | Klein ........................... 326/86 |

* cited by examiner

Primary Examiner—Vu A. Le
(74) Attorney, Agent, or Firm—Dorsey & Whitney LLP (57) ABSTRACT

An open drain driver circuit generates four switching signals to switch respective sets of current driving transistors on and off. The switching signals have slightly different transition times, and the rate at which the magnitude of each switching signal changes during each transition is controlled throughout each transition to maximize the switching times while slowing the rate of change during certain portions of each transition to prevent excessive changes in the rate at which the current changes. As a result, voltage transients generated in power supply lines coupled to the driver circuit have relatively small peak amplitude.

43 Claims, 7 Drawing Sheets

METHOD AND SYSTEM FOR CONTROLLING THE SLEW RATE OF SIGNALS GENERATED BY OPEN DRAIN DRIVER CIRCUITS

TECHNICAL FIELD

This invention relates integrated circuits, and, more particularly, to a method and system for controlling the slew rate of a signal applied to a transmission line using open drain technology to minimize inductive voltage transients internal to packaged devices and minimize other voltage asperties coupled to the transmission line.

BACKGROUND OF THE INVENTION

As the operating speed of electronic systems, such as computer systems and memory devices, continue to increase, the speed at which digital signals must be coupled continues to increase. As a practical matter, the speed at which a digital signal may be coupled through a signal line is reduced if the signal is reflected from various nodes in the signal line, such as connections to the signal line by various electronic circuits. Reflection of digital signals may be avoided by coupling the digital signals through a transmission line having an impedance matched to the impedance of circuitry coupled to the line. Electronic circuits can be designed to be impedance matched to a transmission line in this manner if the number of electronic circuits coupled to the line and the impedance of such circuits remains fixed. However, it is common to vary the number of electronic circuits coupled to a signal lines. For example, in computer systems, the number of memory modules coupled to a memory controller through a data bus, address bus, and control bus may vary. If these buses are impedance matched to the memory modules when the computer system is initially placed in service, the buses may not be impedance matched when additional memory modules are coupled to the buses.

Figure 1:
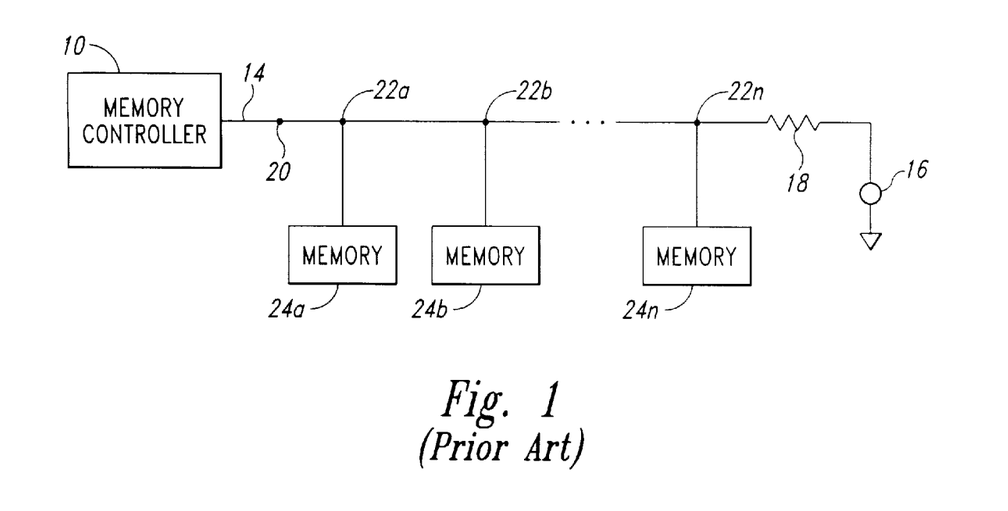
FIG. 1 is block diagram of a memory system using open drain technology in accordance with either the prior art or an embodiment of the invention.

One conventional approach to allowing a varying number of electronic devices to be coupled to a transmission line while maintaining impedance matching between the devices and the line is through open drain technology. The principle of open drain technology can be explained with reference to FIG. 1. As shown in FIG. 1, a memory controller 10 generating a binary signal is coupled to one end of a transmission line 14. An opposite end of the transmission line 14 is coupled to a voltage source 16 through a terminating resistor 18. For purposes of illustration, the voltage of the voltage source 16 is assumed to be 1.5 volts, although it may be any voltage in practice. The resistance of the terminating resistor 18 is substantially the same as the characteristic impedance $Z_0$ of the transmission line 14. For purposes of illustration, the characteristic impedance $Z_0$ of the transmission line 14 and the resistance of the resistor 18 is assumed to be 20 ohms. The signal generated by the memory controller 10 is a switched current signal that switches between two values of current. For example, one binary value may be represented by a current of 0 ma., and the other binary value may be represented by a current of 25 ma. Under these circumstances, a voltage $V_0$ at a node 20 to which the transmission line 14 is coupled will switch between 1.5 volts when the current is 0, and 1.0 volt when the current is 25 ma. The voltage $V_0$ at the node 20 thus switches between two levels to represent respective binary values. Also coupled to the transmission line 14 at a plurality of respective nodes $22a,b \ldots n$ are memory devices $24a,b \ldots n$, which also output a switched current signal.

Although the voltage at the nodes 20 and $22a,b \ldots n$ switch between two values, the effect of doing so by varying the current between two values is significantly different from simply using a switched voltage source to drive the voltage applied to the nodes 20 and $22a,b \ldots n$ between two values. If, for example, the memory device 24b outputs a switched voltage signal on the transmission line 14, the signal will propagate through the transmission line 14 away from the memory device 24b in both directions. When the signal reaches the memory controller 10, it will be reflected from node 20 because of the impedance mismatch between the 25 ohm characteristic impedance of the transmission line 14 and the high impedance at the input to the inactive memory controller 10. By the time the reflected signal reaches the memory device 24a, the memory device 24a may be outputting a signal. If the memory device 24a was outputting a switched voltage signal, the voltage at the node 22a would remain constant despite the reflected signal reaching the node 22a because the memory device 24a would draw or provide sufficient current to maintain the voltage substantially constant. The magnitude of an impedance from an A.C. or transient point of view is proportional to the ratio of the change in voltage to the change in current. Consequently, the input impedance of the memory device 24a resulting from a small change in voltage and a large change in current is relatively small. The low impedance of the memory device 24a would cause further reflection of signal from the node 22a. Furthermore, the impedance at each node $22a,b \ldots n$ would change greatly depending upon whether a memory device $24a,b \ldots n$ was coupled to the node $22a,b \ldots n$.

If a signal was reflected from the memory controller 10 and the memory device 24a was outputting a current switched signal, the effect would be substantially different. In such case, the voltage at the node 22a would change responsive to the reflected signal reaching the node 22a because the memory device 24a maintains the current substantially constant. Consequently, the input impedance of the memory device 24a resulting from a relatively large change in voltage and a very small change in current is relatively large. In fact, the impedance of the memory device 24a may be so large that the memory device 24a has no effect on the signal reflected from the memory controller 10. Under these circumstances, the memory device 24a does not even electrically appear to be coupled to the transmission line 14. The memory devices $24a,b \ldots n$ can therefore be added or removed to the transmission line 14 without altering the performance of the transmission line 14.

In practice, the memory controller 10 and the memory devices 24 are able to drive the transmission line 14 with a switched current signal through a drain of a MOSFET transistor (not shown) that is "open" or unconnected to any other circuitry. The advantages of using this open drain technology are not entirely without some countervailing disadvantages. One disadvantage is the switching of current supplied or drawn by an open drain device generally results in a corresponding change in the power supply current drawn by the device. This change in current drawn by the device through inductive power supply lines (not shown) can produce voltage transients on the power supply lines that result in power supply noise. Such power supply noise can adversely affect the operation of other circuitry in the open drain device as well as other devices that are coupled to the same power source.

Figure 2:
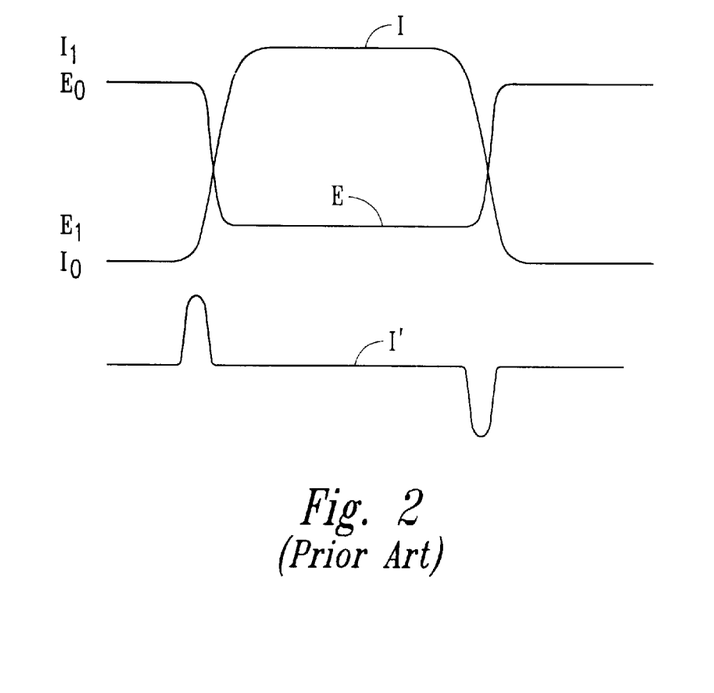
FIG. 2 is a waveform diagram showing the current and voltage generated using basic open drain technology in accordance with the prior art.

The magnitude of a voltage transient is proportional to the inductance of a power supply line through which the current is drawn and the first derivative of the current through the line as a function of time. Thus, reducing the rate of current change, i.e., the first derivative of the current, reduces the magnitude of the voltage transients generated in a power supply line. One approach to reducing the rate of current change in an open drain device will be explained with reference to FIGS. 2 and 3. As shown in FIG. 2, an open drain device outputs a switched current signal I that changes from $I_0$ to $I_1$ and then subsequently back to $I_0$. The switched current signal I results in a voltage E that changes correspondingly from $E_0$ to $E_1$ and then subsequently back to $E_0$. As also shown in FIG. 2, the first derivative I' of the current signal I is a positive pulse coincident with the leading edge of the switched current signal and a negative pulse coincident with the falling edge of the switched current signal.

Figure 3:
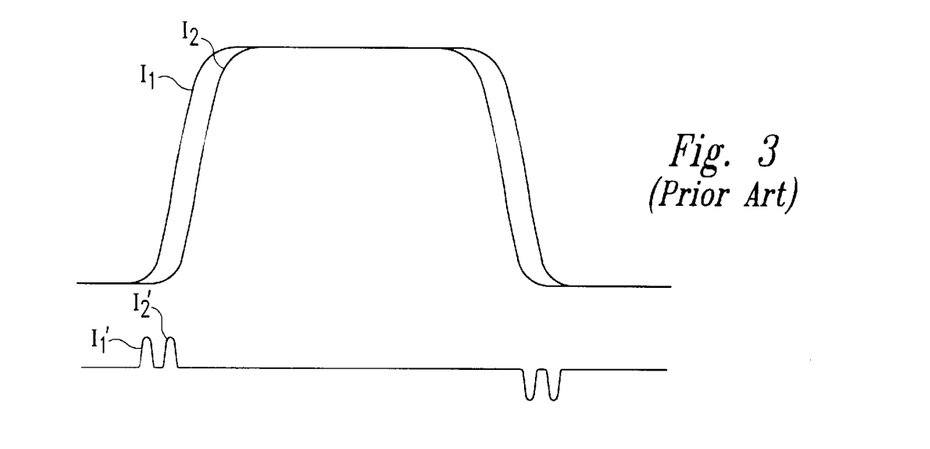
FIG. 3 is a waveform diagram showing the current and voltage generated using an improved open drain technology in accordance with the prior art.

The peak magnitude of the first derivative I' of the current signal I can be reduced using a conventional technique that will be explained with reference to FIG. 3. As shown in FIG. 3, instead of using a single open drain transistor or several open drain transistors switched at the same time, several open drain transistors may be switched at two different times. As a result, the switched current signal I is composed of two switched current signals $I_1$, $I_2$ each of which transitions at a different time. Each of these switched current signals $I_1$, $I_2$ generates a respective voltage (not shown) and a respective first derivative $I_1'$, $I_2'$ of the switched current signals $I_1$, $I_2$. However, since the magnitude of each individual switched voltage signal $I^1$, $I_2$, is relatively small, so also is the magnitude of each individual first derivative signal $I_1'$, $I_2'$. As a result, the peak value of each of the first derivative signals $I_1'$, $I_2'$ is approximately one-half the magnitude of the first derivative signal I' shown in FIG. 2.

Figure 4:
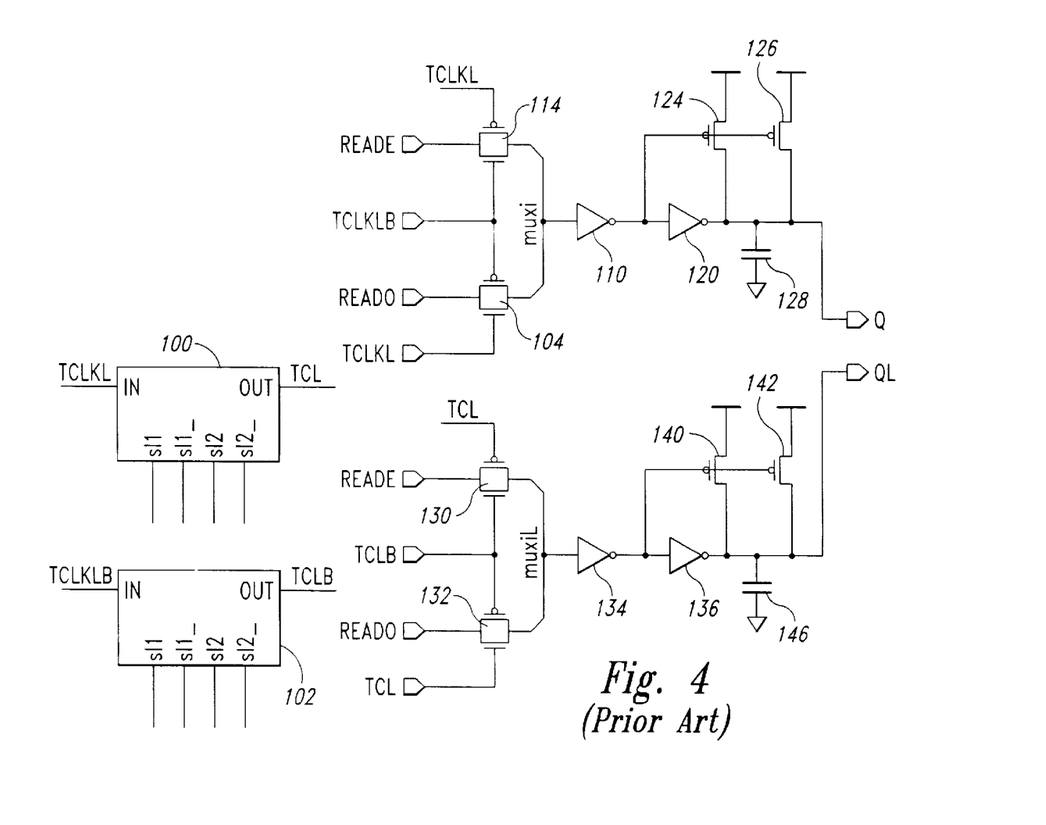
FIGS. 4 and 5 are block and logic diagrams of an open drain driver circuit using the prior art open drain technology generating current and voltage waveforms of the type shown in FIG. 3.
Figure 5:
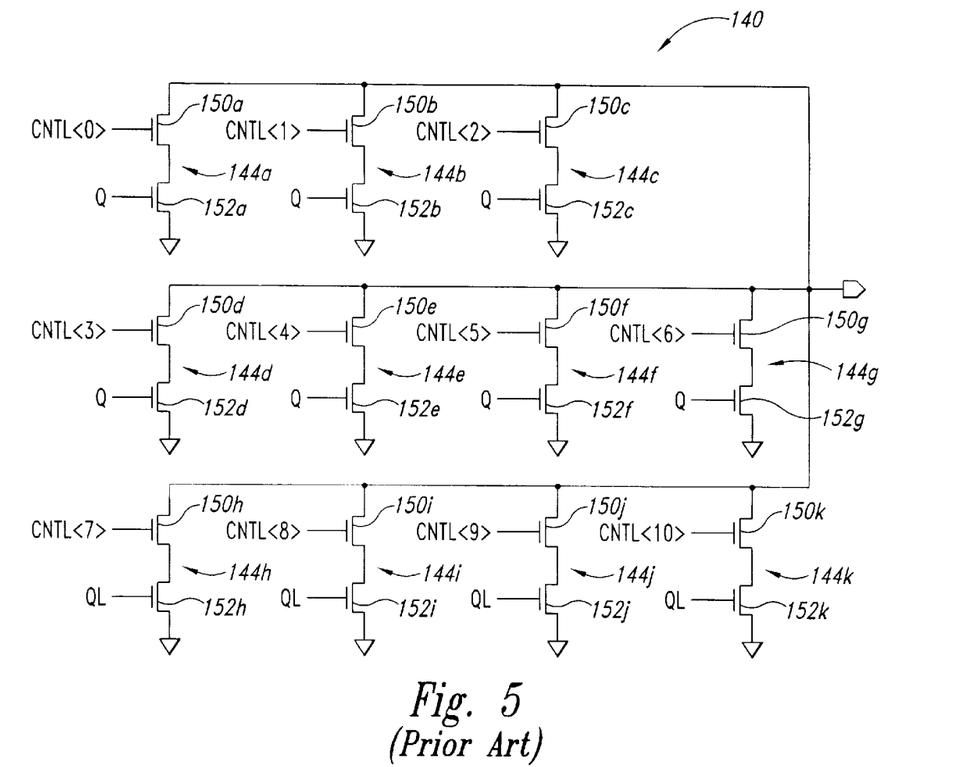
Figure 6:
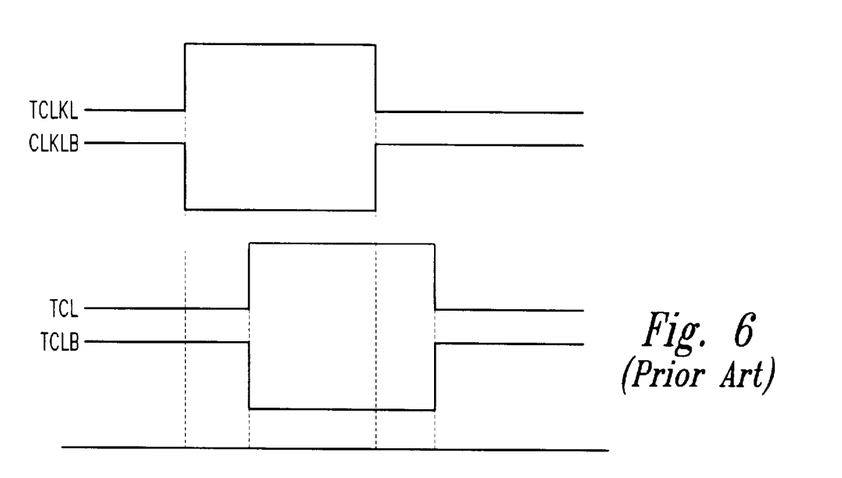
FIG. 6 is a waveform diagram showing the timing of clock signals used in both the prior art circuit of FIGS. 4 and 5 and the embodiment of a circuit in accordance with the invention that is shown in FIGS. 7 and 8.

One conventional circuit for applying a switched current signal to a bus is shown in FIGS. 4 and 5. The circuit will be explained in the context of a memory device, although it will be understood that it may be used with other types of devices. With reference to FIG. 4, a delay circuit 100 receives a clock signal TCLKL and outputs a delayed clock signal TCL after a predetermined delay. Similarly, a delay circuit 102 receives a clock signal TCLKLB and outputs a delayed clock signal TCLB after a predetermined delay. The relative phases of the TCLKL, TCL, TCLKLB and TCLB signals are shown in FIG. 6. As shown in FIG. 6, TCLKL and TCLKB are compliments of each other, and TCL and TCLB are delayed versions of TCLKL and TCLKLB, respectively. The TCLKL signal is initially low and the TCKLB signal is initially high so pass gate 114 is conductive. As a result the MUXI signal corresponds to the level of the READE (i.e., read even) signal from an even data path. In contrast, the READO signal is from an odd data path. When the TCLKL signal subsequently transitions high and the TCLKLB signal transitions low, the pass gate 104 becomes conductive and the pass gate 114 becomes non-conductive, this making the MUXI signal equal to the level of the READO signal. Thus, the MUXI signal is alternately equal to the READE and READO signals. The READE and READO signals are received at either a half data rate (i.e., on every fourth clock transition) or full data rate (i.e., on every other clock transistor), thus making the MUXI signal valid at the full data rate or a double data rate (i.e., every clock transition).

The MUXI signal is applied to the input of an inverter 110. For purposes of explanation, assume the MUXI signal is initially low. The output of the inverter 110 is thus initially high, and it subsequently transitions low. The high-to-low transition at the output of the inverter 110 causes the output of an inverter 120 to transition from low to high. The low at the output of the inverter 110 also turns ON two PMOS transistors 124, 126 that couple the output of the inverter 120 to a supply voltage to assist in the low-to-high transition at the output of the inverter 120. Parasitic capacitance represented by a capacitor 128 has the effect of slightly smoothing transitions at the output of the inverter 120. The resulting signal Q is used by the circuitry shown in FIG. 5, as explained below.

A second pair of pass gates, 130, 132, inverters 134, 136, PMOS transistors 140, 142 and capacitor 146 are interconnected and operate in the same manner as described above with respect to the pass gates, 104, 114, inverters 110, 120, PMOS transistors 124, 126 and capacitor 128 except the pass gates 130, 132 are controlled by the delayed TCL and TCLB signals. As a result, a QL signal is generated from the READE and READO signals at a slightly later time than the Q signal is generated. The resulting signal QL is also used by the circuitry shown in FIG. 5.

With reference to FIG. 5, a driver circuit 140 includes 11 current branch circuits 144a–k coupled in parallel to each other. Each of the branch circuits 144 includes a respective current regulating NMOS transistor 150a–k and a respective switching NMOS transistor 152a–k. The current regulating transistors 150a–k preferably have binary weighted channel widths so that the channel width of each transistor 150 is twice as wide as the channel width of the adjacent transistor 150. Thus, for example, the channel width of the transistor 150c is twice as wide as the channel width of the transistor 150b, and the channel width of the transistor 150d is twice as wide as the channel width of the transistor 150c, etc. The transistors 150a–k are selectively controlled by suitable control signals CNTL<0:10> that are generated by conventional means to select the current draw. The magnitudes of these CNTL<0:10> are typically ground potential or a voltage that is sufficiently low to provide a high drain-to-source impedance for the transistors 150a–K. The switching transistors 152a–g are controlled by the Q signal generated by the circuitry shown in FIG. 4, as previously explained. The switching transistors 152h–k are controlled by the QL signal generated by the circuitry shown in FIG. 4.

As explained above, the Q and QL signals have slightly different phases, thereby producing a switched current signal of the type shown in FIG. 3 composed of two different switched current components switching at different times. Even though the circuitry shown in FIGS. 4 and 5 reduces power supply noise resulting from the switched current signal, it nevertheless produces a degree of power supply noise that can be excessive in some applications. The peak magnitude of the power supply noise could be reduced by increasing the number of differently phased, switched current components used to produce the switched current signal. However, doing so might make the width of the switched current signal excessive and thereby limit the operating speed of memory devices using such open drain technology.

There is therefore a need for an open drain driver circuit and method that can further reduce the magnitude of induced power supply noise without limiting the operating speed of electronic devices using open drain technology.

SUMMARY OF THE INVENTION

An open drain driver circuit and method applies switched current signals to an output terminal responsive to a digital input signal applied to an input terminal. The open drain driver circuit includes a switch control circuit receiving a digital signal at the input terminal. The switch control circuit generates a plurality of switching signals each of which transitions between first and second voltage levels. Significantly, the rate at which at least one of the transitions occurs in a plurality of the switching signals is controlled in at least two phases. The open drain driver circuit also includes a current control circuit coupled to receive the switching signals. The current control circuit is structured to provide the switched current signals at the output terminal having a first magnitude responsive to the switching signals being at the first voltage level and having a second magnitude responsive to the switching signals being at the second voltage level. By controlling the rate at which at least one of the transitions occurs, the rate of change of the current corresponding to the switched current signals can be limited to minimize power supply noise.

DETAILED DESCRIPTION OF THE INVENTION

Figure 7:
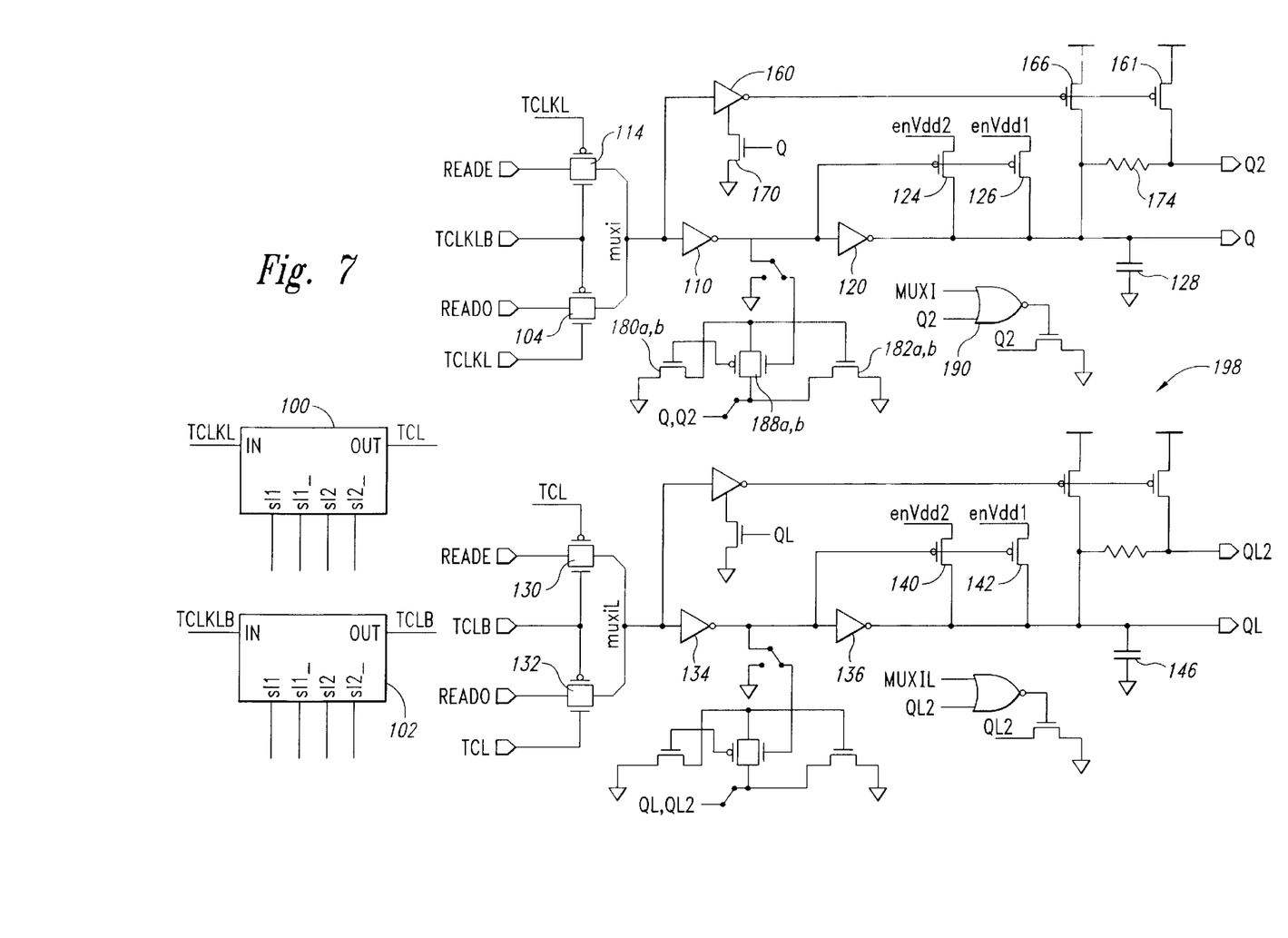
FIGS. 7 and 8 are block diagrams and logic diagrams of an open drain driver circuit creating a reduced level of power supply noise according to one embodiment of the invention.
Figure 8:
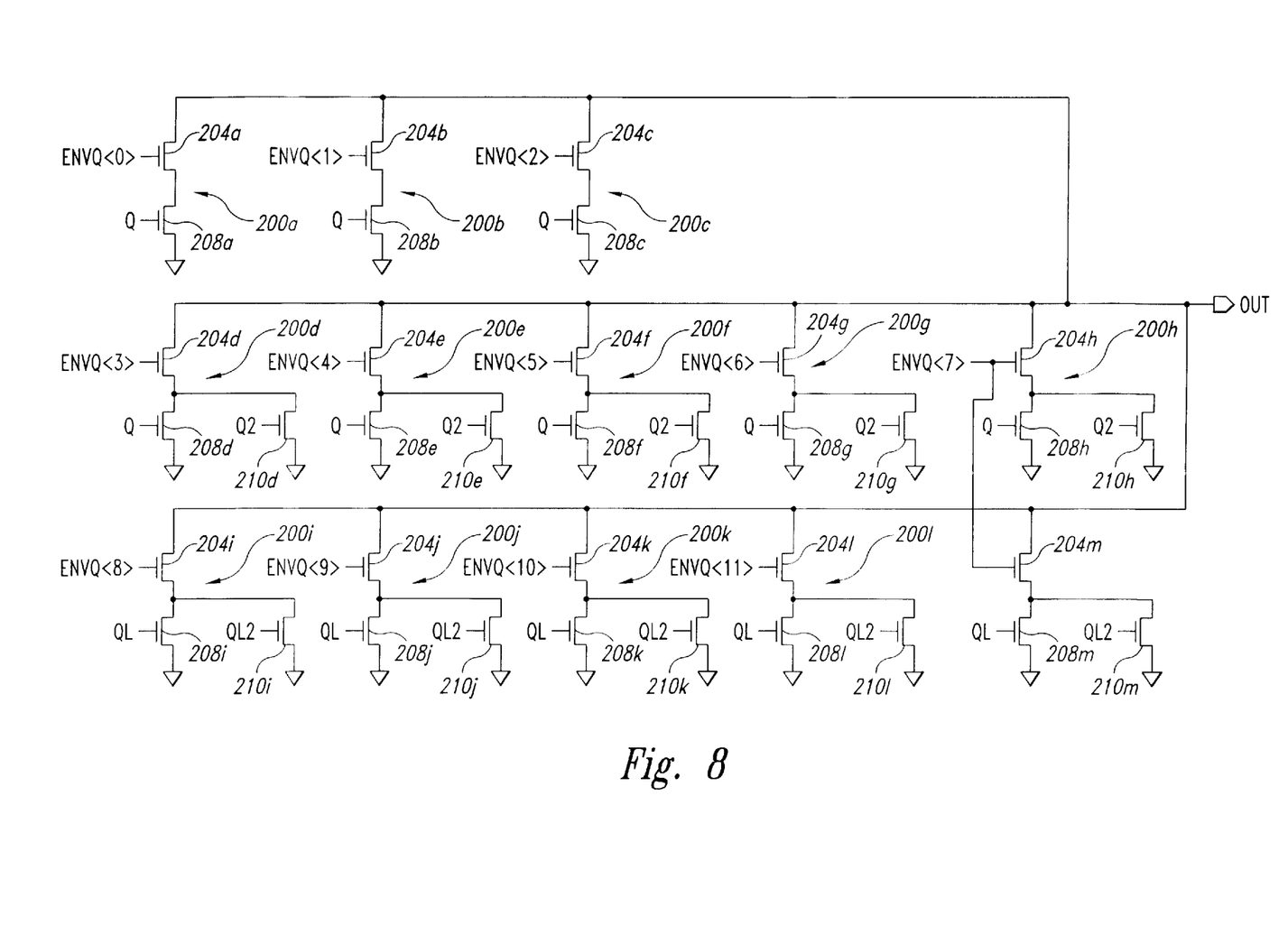

FIGS. 7 and 8 show two portions of an open drain driver circuit according to one embodiment of the invention. The circuitry shown in FIG. 7 substantially corresponds in function to the prior art circuitry shown in FIG. 4, and the circuitry shown in FIG. 8 substantially corresponds in function to the prior art circuitry shown in FIG. 5. In the interest of brevity and clarity, the components of both circuitry that perform and the same function in the same manner will be provided with the same reference numerals and a detailed explanation of such circuitry will not be repeated. As explained in greater detail below, the basic difference between the open drain driver circuit of FIGS. 7 and 8 and the prior art open drain driver circuit of FIGS. 4 and 5 is the open drain driver circuit of FIGS. 7 and 8 controls the rate at which the drive current changes during each transition. Basically, the open drain driver circuit of FIGS. 7 and 8 increases the voltage of the signals Q, Q2, QL, Q2 relatively slowly during a first turn-on phase, and then increases the voltage substantially faster during a second turn-on phase. The voltage of the signals Q, Q2, QL, QL2 in FIGS. 7 and 8 decreases relatively quickly during a first turn-off phase, then decreases substantially slower during a second turn-off phase, and then decreases substantially faster during a final turn-off phase.

With reference to FIG. 7, the MUXI and MUXIL signals are generated from the READE, READO, TCKL, and TCKLB signals in the same manner as in the prior art circuit shown in FIG. 4. The MUXI signal is used to generate the Q signal through a first path formed by the inverters 110, 120, the PMOS transistors 124, 126 and the parascitic capacitance 128 in the same manner as these components do so in the prior art circuit of FIG. 4. When the MUXI signal transitions from low-to-high, this first path increases the magnitude of the Q signal relatively slowly to effect the first turn-on phase. During this first turn-on phase, the Q signal causes the circuit shown in FIG. 8 to increase the current drawn by the driver circuit relatively quickly despite the slow increase in the magnitude of the Q signal.

The MUXI signal is also applied to a second path formed by an inverter 160 and a pair of PMOS transistors 166, 168. When the MUXI signal transitions high, the output of the inverter 160 does not immediately transition low. Instead, the output of the inverter 160 does not transition low until after it is enabled by an NMOS transistor 170 turning ON responsive to the Q signal reaching the threshold voltage $V_T$ of the transistor 170. The low at the output of the inverter 160 then turns ON the two PMOS transistors 166, 168. Turning ON the transistor 166 substantially increases the rate at which the Q signal increases. Turning ON the transistor 168 substantially increases the rate at which the Q2 signal increases, and also further increases the rate at which the Q signal increases through a resistor 174. This more rapid increase in the rate at which the Q signal increases constitutes the second turn-on phase mentioned above. During this second turn-on phase, the more rapidly increasing Q signal, as well as the Q2 signal, insure that both Q and Q2 make it to a full high level before new data is coupled to the inverters 160, 110 the MUXI signal.

As previously mentioned, during turn-off, the current decreases in three phases. Prior to the MUXI signal transitioning low, the high MUXI signal turns ON a pair of NMOS transistors 180a,b (represented by a single transistor), thereby coupling the gate of a respective NMOS transistor 182a,b to ground to turn OFF the transistors 182a,b. When the MUXI signal transitions low, the low MUXI signal and the resulting high signal at the output of the inverter 110 render respective pass gates 188a,b (again represented by a single pass gate) conductive. The pass gates 188a,b then couple the gates of the respective transistors 182a,b to their drains, which are also coupled to the respective Q and Q2 signals. The transistors 182a,b then act as diodes through which the Q and Q2 signals are coupled to ground. During this first turn-off phase, the high-to-low transition of the MUXI signal at the input of the inverter 110 is also coupled through the inverter 120 to assist in driving the Q signal low. Similarly, the high-to-low transition of the MUXI signal at the input of the inverter 160 causes the PMOS transistors 166, 168 to turn OFF, thereby assisting in driving the Q2 signal low. As a result, the Q and Q2 signals quickly decrease during this first turn-off phase.

When the magnitudes of the Q and Q2 signals have decreased during the first turn-off phase to the threshold voltage $V_T$ of the transistors 182a,b, the transistors 182a,b turn OFF, so the Q and Q2 signals are no longer shunted to ground. However, the Q and Q2 signal are still being driven low through the inverters 110, 120, and the inverter 160 and the PMOS transistors 166, 168. The magnitudes of the Q and Q2 signals decrease more slowly near the $V_T$ of the transistors 182a, b during this second turn-off phase to cause the circuit shown in FIG. 8 to minimize the peak rate of change of the current.

The Q2 signal is also applied to one input of a NOR gate 190, which is enabled by the low MUXI signal. When the magnitude of the Q2 signal has decreased during the second turn-off phase to a level corresponding to logic "0", the output of a NOR gate 190 transitions high, thereby turning ON an NMOS transistor 194 to shunt the Q2 signal to ground. The magnitude of the Q2 signal then decreases at a more rapid rate during this third turn-off phase to insure Q2 and Q through a resistor achieve ground potential before MUXI receives new data.

The portion of the driver circuit shown in FIG. 7 also includes circuitry 198 for generating QL and QL2 signals. This circuitry is identical in structure and operation to the circuitry 198 for driving Q and Q2 signals. Therefore, an explanation of the operation of such circuitry will not be repeated. The QL and QL2 signals are driven high in the same two distinct turn-on phases as the Q and Q2 signals, and they are driven low in the same three turn-off phases as the Q and Q2 signals.

The Q, Q2, QL and QL2 signals are applied to the portion of the driver circuitry shown in FIG. 8. With reference to FIG. 8, three current branch circuits 200a,b,c are coupled in parallel with each other. Each of the branch circuits 200a,b,c includes a respective NMOS current regulating transistor 204a,b,c and a respective MOS switching transistor 208a, b,c. The switching transistors 208a,b,c are driven by the Q signals. The current regulating transistors 204a,b,c are selectively controlled by suitable control signals CNTL<0:10> that are generated by conventional means to maintain the source-to-drain resistance of the transistors 204 relatively low.

The portion of the driver circuitry shown in FIG. 8 also includes five additional current branch circuits 200d–h that are also coupled in parallel with each other and with the current branch circuits 200a,b,c. Each of the branch circuits 200d–h includes a respective NMOS current regulating transistor 204d–h and a respective pair of NMOS switching transistor 208d–h and 210d–h. The switching transistors 208d–h are driven by the Q signals, while the switching transistors 210d–h are driven by the Q2 signals. As explained below, using a pair of transistors 208, 210 in each branch circuit 200 allows the rate of the current drawn by the branch circuits 200 to be better controlled while the current draw is being increased and decreased.

Finally, the driver circuitry shown in FIG. 8 also includes five additional current branch circuits 200i–m that are also coupled in parallel with each other and with the current branch circuits 200a–h. Each of the branch circuits 200i–m includes a respective NMOS current regulating transistor 204i–m and a respective pair of NMOS switching transistor 208i–m and 210i–m. The switching transistors 208i–m are driven by the QL signals, while the switching transistors 210i–m are driven by the QL2 signals. Again, using a pair of transistors 208, 210 in each branch circuit 200 allows the rate of the current drawn by the branch circuits 200 to be better controlled while the current draw is being increased and decreased.

In operation, during the first turn-on phase, the slow increase in the magnitude of the Q signal turns ON the switching transistors 208a–h relatively slowly. During this same time, the slow increase in the magnitude of the QL signal turns ON the switching transistors 208i–m relatively slowly, but the time at which the switching transistors 208i–m are turned on can be different from the time the switching transistors 208a–h are turned ON. As a result, during this first phase, the transistors 208 are driven through their saturation region relatively slowly to limit the rate at which the current drawn by the branch circuits 200a–m increases. After the transistors 208 have been driven through their saturation region, the Q and QL signals enter the second turn-on phase. During this phase, the Q and QL signals increase at a more rapid rate because of he PMOS transistor 166 turning ON, thereby more rapidly turning ON the transistors 208. Slightly delayed, the rapid increase of the Q2 and QL2 signals quickly turns ON the transistors 210.

When the MUXI signal transitions low, the shunting of the Q, Q2, QL and QL2 signals by the NMOS transistors 182a,b quickly drive the transistors 208, 210 to near their saturation operating region during the first turn-off phase. The Q, Q2, QL and QL2 signals continue to decrease during the second turn-off phase, as previously explained. It is during this second turn-off phase when the transistors 208, 210 are being driven from linear to saturation region that the current can decrease too rapidly if the Q, Q2, QL and QL2 signals driving them decrease too rapidly. However, when the transistors 208, 210 reach toward the lower part of their saturation operating region, they may be turned OFF at a more rapid rate without excessively increasing the rate at which the current draw changes. Consequently, during this third turn-off phase the Q2 and QL2 signals are shunted to ground by the NMOS transistor 194, as explained above. The driver circuit embodiment shown in FIGS. 7 and 8 thus alters the rate at which the current draw increases and decreases during each transition to maximize the switching speed of the driver circuit without unduly increasing the rate at which the current draw changes.

Figure 9A:
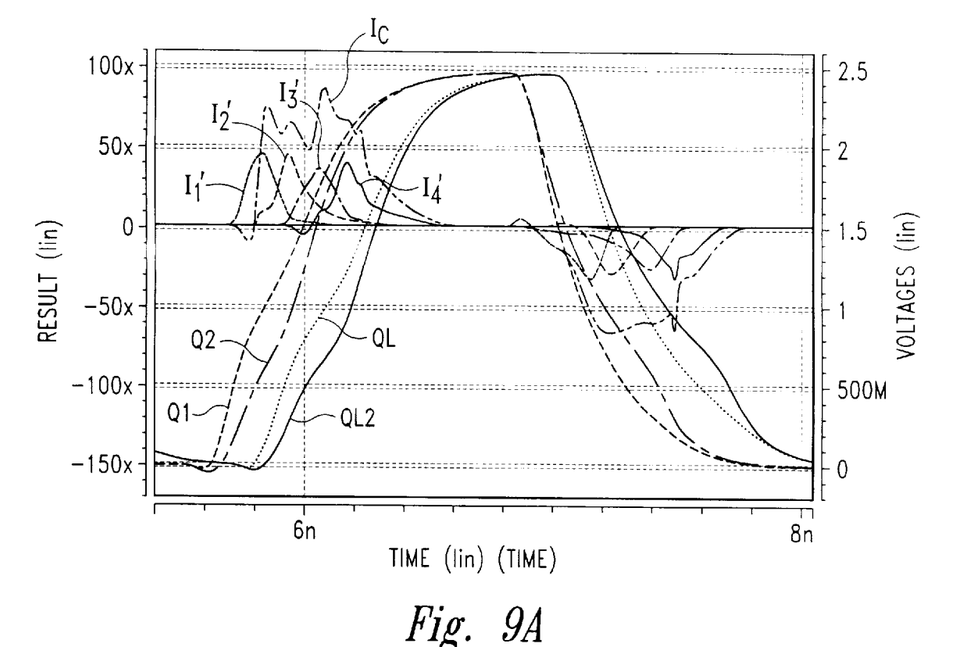
FIG. 9 is a waveform diagram showing the current and voltage generated using the open drain driver circuit of FIGS. 7 and 8.
Figure 9B:
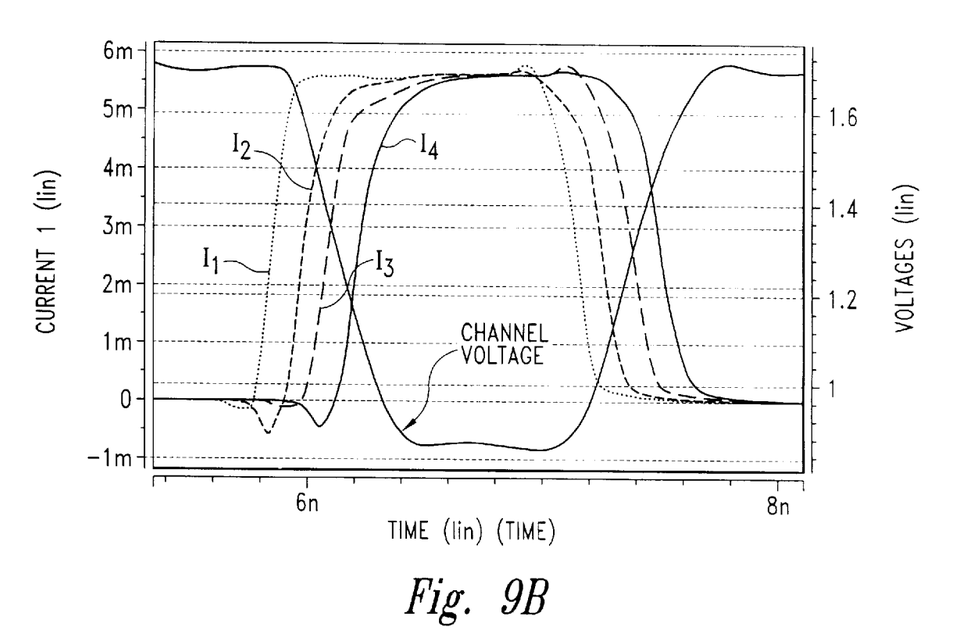

The switched current signal produced by the open drain driver circuit of FIGS. 7 and 8 is shown in FIG. 9. As shown therein, 4 switched current signals $I_1$, $I_2$, $I_3$, $I_4$ are generated responsive to respective transitions of the Q, Q2, QL and QL2 signals. During each transition of the switched current signals $I_1$, $I_2$, $I_3$, $I_4$, respective voltages induced by the changes in current are generated, as indicated by the signals $I_1'$, $I_2'$, $I_3'$, $I_4'$. Also shown is a composite signal $I_c$ resulting from a combination of the signals $I_1'$, $I_2'$, $I_3'$, $I_4'$. The amplitude of this signal $I_C$ is relatively low because the rate of change of each of the switched current signals is controlled during their transitions, as explained above.

Figure 10:
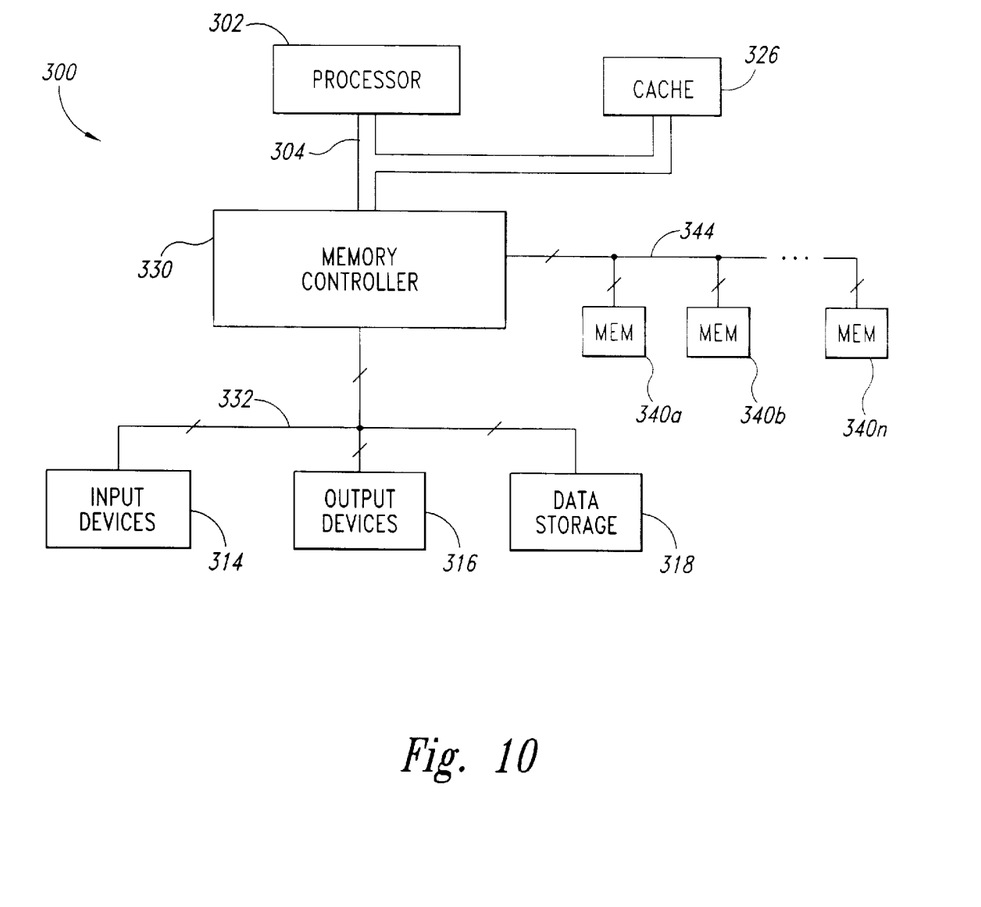
FIG. 10 is a block diagram of a computer system having a plurality of memory device each of which includes a plurality of the open drain driver circuits of FIGS. 7 and 8.

A computer using a plurality of memory devices each containing several of the open drain driver circuits of FIGS. 7 and 8 is shown in FIG. 10. The computer system 300 includes a processor 302 for performing various computing functions, such as executing specific software to perform specific calculations or tasks. The processor 302 includes a processor bus 304 that normally includes an address bus, a control bus, and a data bus. The computer system 300 also includes a memory controller 330 or similar device, such as a system controller, coupled to an expansion bus 332, such a Peripheral Component Interconnect ("PCI") bus. The expansion bus 332 is coupled to one or more input devices 314, such as a keyboard or a mouse, to allow an operator to interface with the computer system 300. Typically, the computer system 300 also includes one or more output devices 316 coupled to the processor 302, through the expansion bus 332, memory controller 330 and processor bus 304. Typical output devices are a printer and a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM")

The computer system 300 also includes a plurality of memory devices 340a,b . . . n coupled to the memory controller 330 through a bus system 344. The bus system 344 may include a control bus, an address bus, and a data bus, or some other type of bus system. Regardless of which bus system 344 is used in the computer system 300, the bus system 344 includes a plurality of signal conductors (not shown in FIG. 10), at least some of which are formed by respective transmission lines. Preferably transmission lines are used for at least the bus lines used to couple data between the memory devices 340a,b . . . n and the memory controller 330. Each of the memory devices 340a,b . . . n includes an open drain driver circuit, such as the embodiment of FIGS. 7 and 8, coupled to each transmission line. The bus system 344 is thus able to couple data between the memory controller and each of the memory devices 340a,b . . . n at optimum speed regardless of whether memory devices 340a,b . . . n are added to or removed from the computer system 300. The use of an open drain driver in accordance with an embodiment of the invention minimizes voltage transients induced in power supply lines 350 applying power to the memory devices 340a,b . . . n responsive to transitions in switched current signals generated by the open drain driver circuits in either the memory controller 330 or the memory devices 340a,b . . . n.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An open drain driver circuit having an output terminal and an input terminal, comprising:
a switch control circuit receiving a digital input signal at the input terminal, the switch control circuit comprising:
a first signal path through which the input signal is coupled to provide a first switching signal;
a second signal path through which the input signal is coupled to provide a second switching signal, the second signal path responding to the input signal to provide the second switching signal at a time and at a rate that is different from the time and rate at which the first signal path responds to the input signal to provide the first switching signal; and
a current control circuit coupled to receive the first and second switching signals, the current control circuit being structured to draw or provide current at the output terminal having a first magnitude when the first switching signal is at a first logic level and the second switching signal is at the first logic level, having a second magnitude when the first switching signal is at a second logic level and the second switching signal is at the first logic level, having a third magnitude when the first switching signal is at the second logic level and the second switching signal is at the second logic level, and having a fourth magnitude when the first switching signal is at the first logic level and the second switching signal is at the second logic level.

2. The open drain driver circuit of claim 1 further comprising a shunting circuit selectively shunting one of the switching signals to a reference voltage, the shunting circuit being operable to shunt the switching signal during a portion of a transition of a transition of the switching signal from the first logic level to the second logic level.

3. The open drain driver circuit of claim 2 wherein the shunting circuit is operable to shunt the switching signal during an initial portion of a transition of a transition of the switching signal from the first logic level to the second logic level.

4. The open drain driver circuit of claim 2 wherein the shunting circuit is operable to shunt the switching signal during a final portion of a transition of a transition of the switching signal from the first logic level to the second logic level.

5. The open drain driver circuit of claim 2 wherein the shunting circuit comprises:
an NMOS diode-coupled transistor having its source coupled to the reference voltage; and
a switch coupling the drain of the diode-coupled transistor to one of the switching signals when the input signal has a predetermined logic level.

6. The open drain driver circuit of claim 2 wherein the shunting circuit comprises:
a MOSFET transistor having a gate, a drain coupled to the shunted switching signal, and a source coupled to the reference voltage; and
a logic gate having an input terminal receiving the shunted switching signal, the logic gate generating a control signal at an output terminal that switches state responsive to the shunted switching signal being within a predetermined range of voltages, the output terminal of the logic gate being coupled to the drain of the gate of the MOSFET transistor.

7. The open drain driver circuit of claim 1, wherein the first signal path comprises a pair of serially coupled inverters.

8. The open drain driver circuit of claim 1, wherein the second signal path comprises:
an enableable driver circuit having an input terminal coupled to receive the digital input signal and an output terminal, the driver circuit being enabled by the first switching signal being within a predetermined range;
a switching transistor having a control input coupled to the output terminal of the driver circuit, the switching transistor generating the second switching signal responsive to the switching transistor being switched to a conductive state.

9. An open drain driver circuit having an output terminal and an input terminal, comprising:
a switch control circuit receiving a digital signal at the input terminal, the switch control circuit being structured to generate a plurality of switching signals each of which transitions between first and second voltage levels, the rate at which at least one of the transitions occurs in a plurality of the switching signals being controlled in at least two phases; and
a current control circuit coupled to receive the switching signals, the current control circuit being structured to draw or provide current at the output terminal having a first magnitude responsive to the switching signals being at the first voltage level and to draw or provide current at the output terminal having a second magnitude responsive to the switching signals being at the second voltage level.

10. The open drain driver circuit of claim 9, wherein the switch control circuit is structured to control the rate at which the plurality of switching signals transition when the switching signals transition both from the first voltage level to the second voltage level and from the second voltage level to the first voltage level.

11. The open drain driver circuit of claim 9, wherein switching signals having the first voltage level cause the current control circuit to draw or provide current no current, and switching signals having the second voltage level cause the current control circuit to draw or provide a predetermined magnitude of current, and wherein the switch control circuit is structured to control the rate at which the plurality of the switching signals transition from the second voltage level to the first voltage level in three phases.

12. The open drain driver circuit of claim 9, wherein switching signals having the first voltage level cause the current control circuit to draw or provide current no current, and switching signals having the second voltage level cause the current control circuit to draw or provide a predetermined magnitude of current, and wherein the switch control circuit is structured to control the rate at which the plurality of the switching signals transition from the first voltage level to the second voltage level in first and second phases, the switching signals transitioning relatively slowly during the first phase and transitioning relatively quickly during the second phase.

13. The open drain driver circuit of claim 12 wherein the first voltage level has a magnitude that is less than the second voltage level such that the magnitudes of the switching signals increase in transitioning from the first voltage level to the second voltage level.

14. The open drain driver circuit of claim 9, wherein switching signals having the first voltage level cause the current control circuit to draw or provide current no current, and switching signals having the second voltage level cause the current control circuit to draw or provide a predetermined magnitude of current, and wherein the switch control circuit is structured to control the rate at which the plurality of the switching signals transition from the second voltage level to the first voltage level in first, second and third phases, the switching signals transitioning relatively quickly during the first phase, transitioning relatively slowly during the second phase, and transitioning relatively quickly during the third phase.

15. The open drain driver circuit of claim 14 wherein the second voltage level has a magnitude that is greater than the first voltage level such that the magnitudes of the switching signals decrease in transitioning from the second voltage level to the first voltage level.

16. The open drain driver circuit of claim 9, wherein switching signals cause the current drawn or provided by the current control circuit to increase from a zero current level to a predetermined current level in first and second phases, the magnitude of the current drawn or provided being increased relatively quickly during the first phase and being increased relatively slowly during the second phase.

17. The open drain driver circuit of claim 9, wherein switching signals cause the current drawn or provided by the current control circuit to decrease from a predetermined current level to zero current level in first, second and third phases, the magnitude of the current drawn or provided being decreased relatively quickly during the second phase.

18. A memory system comprising:
a transmission line having a characteristic impedance;
a bias voltage source coupled to one end of the transmission line, the bias voltage source having an impedance corresponding to the characteristic impedance of the transmission line;
a memory controller operable to generate control, address and data signals, the memory controller having a data terminal coupled to the transmission line at an end opposite the end to which the bias voltage source is coupled, the memory controller including an open drain driver circuit applying the data signals to the transmission line through the data terminal, the open drain driver circuit comprising:
a switch control circuit receiving read data signals at an input terminal, the switch control circuit comprising:
a first signal path through which the read data signals are coupled to provide a first switching signal;
a second signal path through which the read data signals are coupled to provide a second switching signal, the second signal path responding to the read data signals to provide the second switching signal at a time and at a rate that is different from the time and rate at which the first signal path responds to the read data signals to provide the first switching signal; and
a current control circuit coupled to receive the first and second switching signals, the current control circuit being structured to draw or provide current at the data terminal having a first magnitude when the first switching signal is at a first logic level and the second switching signal is at the first logic level, having a second magnitude when the first switching signal is at a second logic level and the second switching signal is at the first logic level, having a third magnitude when the first switching signal is at the second logic level and the second switching signal is at the second logic level, and having a fourth magnitude when the first switching signal is at the first logic level and the second switching signal is at the second logic level; and
a plurality of memory devices operable to receive control and address signals and to generate data signals, each of the memory devices having a data terminal coupled to the transmission line between the memory controller and the bias voltage source, each of the memory devices including a respective open drain driver circuit applying the data signals to the transmission line through the data terminal, the open drain driver circuit comprising:
a switch control circuit receiving read data signals at an input terminal, the switch control circuit comprising:
a first signal path through which the read data signals are coupled to provide a first switching signal;
a second signal path through which the read data signals are coupled to provide a second switching signal, the second signal path responding to the read data signals to provide the second switching signal at a time and at a rate that is different from the time and rate at which the first signal path responds to the read data signals to provide the first switching signal; and
a current control circuit coupled to receive the first and second switching signals, the current control circuit being structured to draw or provide current at the data terminal having a first magnitude when the first switching signal is at a first logic level and the second switching signal is at the first logic level, having a second magnitude when the first switching signal is at a second logic level and the second switching signal is at the first logic level, having a third magnitude when the first switching signal is at the second logic level and the second switching signal is at the second logic level, and having a fourth magnitude when the first switching signal is at the first logic level and the second switching signal is at the second logic level.

19. The memory system of claim 18 further comprising a shunting circuit selectively shunting one of the switching signals to a reference voltage, the shunting circuit being operable to shunt the switching signal during a portion of a transition of a transition of the switching signal from the first logic level to the second logic level.

20. The memory system of claim 19 wherein the shunting circuit is operable to shunt the switching signal during an initial portion of a transition of a transition of the switching signal from the first logic level to the second logic level.

21. The memory system of claim 19 wherein the shunting circuit is operable to shunt the switching signal during a final portion of a transition of a transition of the switching signal from the first logic level to the second logic level.

22. The memory system of claim 19 wherein the shunting circuit comprises:
an NMOS diode-coupled transistor having its source coupled to the reference voltage; and
a switch coupling the drain of the diode-coupled transistor to one of the switching signals when the input signal has a predetermined logic level.

23. The memory system of claim 19 wherein the shunting circuit comprises:
a MOSFET transistor having a gate, a drain coupled to the shunted switching signal, and a source coupled to the reference voltage; and
a logic gate having an input terminal receiving the shunted switching signal, the logic gate generating a control signal at an output terminal that switches state responsive to the shunted switching signal being within a predetermined range of voltages, the output terminal of the logic gate being coupled to the drain of the gate of the MOSFET transistor.

24. The memory system of claim 18, wherein the first signal path comprises a pair of serially coupled inverters.

25. The memory system of claim 18, wherein the second signal path comprises:
an enableable driver circuit having an input terminal coupled to receive the digital input signal and an output terminal, the driver circuit being enabled by the first switching signal being within a predetermined range;
a switching transistor having a control input coupled to the output terminal of the driver circuit, the switching transistor generating the second switching signal responsive to the switching transistor being switched to a conductive state.

26. A memory system comprising:
a transmission line having a characteristic impedance;
a bias voltage source coupled to one end of the transmission line, the bias voltage source having an impedance corresponding to the characteristic impedance of the transmission line;
a memory controller operable to generate control, address and data signals, the memory controller having a data terminal coupled to the transmission line at an end opposite the end to which the bias voltage source is coupled, the memory controller including an open drain driver circuit applying the data signals to the transmission line through the data terminal, the open drain driver circuit comprising:
a switch control circuit receiving a read data signal at an input terminal, the switch control circuit being structured to generate a plurality of switching signals each of which transitions between first and second voltage levels, the rate at which at least one of the transitions occurs in a plurality of the switching signals being controlled in at least two phases; and
a current control circuit coupled to receive the switching signals, the current control circuit being structured to draw or provide current at the data terminal having a first magnitude responsive to the switching signals being at the first voltage level and to draw or provide current at the output terminal having a second magnitude responsive to the switching signals being at the second voltage level; and
a plurality of memory devices operable to receive control and address signals and to generate data signals, each of the memory devices having a data terminal coupled to the transmission line between the memory controller and the bias voltage source, each of the memory devices including a respective open drain driver circuit applying the data signals to the transmission line through the data terminal, the open drain driver circuit comprising:
a switch control circuit receiving a read data signal at an input terminal, the switch control circuit being structured to generate a plurality of switching signals each of which transitions between first and second voltage levels, the rate at which at least one of the transitions occurs in a plurality of the switching signals being controlled in at least two phases; and
a current control circuit coupled to receive the switching signals, the current control circuit being structured to draw or provide current at the data terminal having a first magnitude responsive to the switching signals being at the first voltage level and to draw or provide current at the output terminal having a second magnitude responsive to the switching signals being at the second voltage level.

27. The memory system of claim 26, wherein the switch control circuit is further structured to control the rate at which the plurality of switching signals transition from the first voltage level to the second voltage level and from the second voltage level to the first voltage level.

28. The memory system of claim 26, wherein switching signals having the first voltage level cause the current control circuit to draw or provide current no current, and switching signals having the second voltage level cause the current control circuit to draw or provide a predetermined magnitude of current, and wherein the switch control circuit is structured to control the rate at which the plurality of the switching signals transition from the second voltage level to the first voltage level in three phases.

29. The memory system of claim 26, wherein switching signals having the first voltage level cause the current control circuit to draw or provide current no current, and switching signals having the second voltage level cause the current control circuit to draw or provide a predetermined magnitude of current, and wherein the switch control circuit is structured to control the rate at which the plurality of the switching signals transition from the first voltage level to the second voltage level in first and second phases, the switching signals transitioning relatively slowly during the first phase and transitioning relatively quickly during the second phase.

30. The memory system of claim 29 wherein the first voltage level has a magnitude that is less than the second voltage level such that the magnitudes of the switching signals increase in transitioning from the first voltage level to the second voltage level.

31. The memory system of claim 26, wherein switching signals having the first voltage level cause the current control circuit to draw or provide current no current, and switching signals having the second voltage level cause the current control circuit to draw or provide a predetermined magnitude of current, and wherein the switch control circuit is structured to control the rate at which the plurality of the switching signals transition from the second voltage level to the first voltage level in first, second and third phases, the switching signals transitioning relatively quickly during the first phase, transitioning relatively slowly during the second phase, and transitioning relatively quickly during the third phase.

32. The memory system of claim 31 wherein the second voltage level has a magnitude that is greater than the first voltage level such that the magnitudes of the switching signals decrease in transitioning from the second voltage level to the first voltage level.

33. The memory system of claim 26, wherein switching signals cause the current drawn or provided by the current control circuit to increase from a zero current level to a predetermined current level in first and second phases, the magnitude of the current drawn or provided being increased relatively quickly during the first phase and being increased relatively slowly during the second phase.

34. The memory system of claim 26, wherein switching signals cause the current drawn or provided by the current control circuit to decrease from a predetermined current level to zero current level in first, second and third phases, the magnitude of the current drawn or provided being decreased relatively quickly during the second phase.

35. A method of generating a switched current signal, comprising:

generating a plurality of switching signals each of which transitions between first and second voltage levels, the rate at which at least one of the transitions occurs in a plurality of the switching signals being controlled in at least two phases; and drawing current or providing current at the output terminal having a first magnitude responsive to the switching signals being at the first voltage level and drawing or providing current at the output terminal having a second magnitude responsive to the switching signals being at the second voltage level.

36. The method of claim 35 wherein the act of controlling the rate at which at least one of the transitions occurs in a plurality of the switching signals comprises controlling the rate at which the plurality of switching signals transition from the first voltage level to the second voltage level and from the second voltage level to the first voltage level.

37. The method of claim 35 wherein switching signals having the first voltage level cause the current control circuit to draw or provide current no current, and switching signals having the second voltage level cause the current control circuit to draw or provide a predetermined magnitude of current, and wherein the act of controlling the rate at which at least one of the transitions occurs in a plurality of the switching signals comprises controlling the rate at which the plurality of the switching signals transition from the second voltage level to the first voltage level in three phases.

38. The method of claim 35, wherein switching signals having the first voltage level cause the current control circuit to draw or provide current no current, and switching signals having the second voltage level cause the current control circuit to draw or provide a predetermined magnitude of current, and wherein the act of controlling the rate at which at least one of the transitions occurs in a plurality of the switching signals comprises controlling the rate at which the plurality of the switching signals transition from the first voltage level to the second voltage level in first and second phases, the switching signals transitioning relatively slowly during the first phase and transitioning relatively quickly during the second phase.

39. The method of claim 38 wherein the first voltage level has a magnitude that is less than the second voltage level such that the magnitudes of the switching signals increase in transitioning from the first voltage level to the second voltage level.

40. The method of claim 36 wherein switching signals having the first voltage level cause the current control circuit to draw or provide current no current, and switching signals having the second voltage level cause the current control circuit to draw or provide a predetermined magnitude of current, and wherein the act of controlling the rate at which at least one of the transitions occurs in a plurality of the switching signals comprises controlling the rate at which the plurality of the switching signals transition from the second voltage level to the first voltage level in first, second and third phases, the switching signals transitioning relatively quickly during the first phase, transitioning relatively slowly during the second phase, and transitioning relatively quickly during the third phase.

41. The method of claim 40 wherein the second voltage level has a magnitude that is greater than the first voltage level such that the magnitudes of the switching signals decrease in transitioning from the second voltage level to the first voltage level.

42. The method of claim 35 wherein the switching signals cause the current drawn or provided to increase from a zero current level to a predetermined current level in first and second phases, the magnitude of the current drawn or provided being increased relatively quickly during the first phase and being, increased, relatively slowly during the second phase.

43. The method of claim 35 wherein the switching signals cause the current drawn or provided by the current control circuit to decrease from a predetermined current level to zero current level in first, second and third phases, the magnitude of the current drawn or provided being decreased relatively quickly during the second phase.

* * * * *

UNITED STATES PATENT AND TRADEMARK OFFICE
CERTIFICATE OF CORRECTION

PATENT NO.      : 6,366,520 B1
DATED           : April 2, 2002
INVENTOR(S)     : Brian W. Huber It is certified that error appears in the above-identified patent and that said Letters Patent is hereby corrected as shown below:

<u>Column 7,</u>
Line 29, reads "MOS" should read -- NMOS --

Signed and Sealed this

Twenty-eighth Day of January, 2003

JAMES E. ROGAN
*Director of the United States Patent and Trademark Office*